US008987923B2

(12) United States Patent
Chou et al.

(10) Patent No.: US 8,987,923 B2
(45) Date of Patent: Mar. 24, 2015

(54) SEMICONDUCTOR SEAL RING

(71) Applicant: Taiwan Semiconductor Manufacturing Company Limited, Hsin-Chu (TW)

(72) Inventors: Chien-Chih Chou, New Taipei (TW); Huei-Ru Liou, Taoyuan County (TW); Kong-Beng Thei, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 18 days.

(21) Appl. No.: 13/660,392

(22) Filed: Oct. 25, 2012

(65) Prior Publication Data
US 2014/0035128 A1 Feb. 6, 2014

Related U.S. Application Data

(60) Provisional application No. 61/677,842, filed on Jul. 31, 2012.

(51) Int. Cl.
*H01L 23/58* (2006.01)
*H01L 23/48* (2006.01)
*H01L 21/4763* (2006.01)
(Continued)

(52) U.S. Cl.
CPC .............. *H01L 23/585* (2013.01); *H01L 21/78* (2013.01); *H01L 23/3192* (2013.01); *H01L 24/29* (2013.01); *H01L 24/32* (2013.01); *H01L 24/83* (2013.01); *H01L 2224/2929* (2013.01);
(Continued)

(58) Field of Classification Search
CPC ... H01L 23/28; H01L 23/562; H01L 23/5226; H01I 21/78677; H01I 21/76843
USPC .......... 438/115, 597, 598, 618, 622; 257/737, 257/798
See application file for complete search history.

(56) References Cited

U.S. PATENT DOCUMENTS 6,022,791 A * 2/2000 Cook et al. .................... 438/458
6,861,754 B2 3/2005 Lin et al.
(Continued)

OTHER PUBLICATIONS

"Anisotropic conductive film", Jun. 15, 2012, pp. 1-4, http://en.wikipedia.org/wiki/Anisotropic_conductive_film.
(Continued)

*Primary Examiner* — Karen Kusumakar
(74) *Attorney, Agent, or Firm* — Cooper Legal Group, LLC

(57) ABSTRACT

Among other things, a semiconductor seal ring and method for forming the same are provided. The semiconductor seal ring comprises a plurality of dielectric layers formed over a semiconductor substrate upon which a semiconductor device is formed. A plurality of conductive layers is arranged among at least some of the plurality of dielectric layers. An upper conductive layer is formed over the plurality of dielectric layers. An upper passivation layer is formed over the upper conductive layer to isolate the upper conductive layer from conductive debris resulting from a die saw process along a die saw cut line. In an example, a first columnar region comprising a first portion of the conductive layers is electrically isolated from the semiconductor device because the first columnar region is disposed relatively close to the die saw cut line and thus can be exposed to conductive debris which can cause undesired short circuits.

20 Claims, 5 Drawing Sheets

(51) Int. Cl.
H01L 21/44 (2006.01)
H01L 21/00 (2006.01)
*H01L 21/78* (2006.01)
*H01L 23/31* (2006.01)
*H01L 23/00* (2006.01)

(52) U.S. Cl.
CPC ............... *H01L 2224/293* (2013.01); *H01L 2224/32225* (2013.01); *H01L 2224/83851* (2013.01); *H01L 2924/14* (2013.01)
USPC .......... 257/798; 257/737; 438/618; 438/622; 438/115; 438/597; 438/598

(56) References Cited

U.S. PATENT DOCUMENTS

| | | |
|---|---|---|
| 7,485,549 B2 | 2/2009 | Mallikarjunaswamy et al. |
| 7,602,065 B2 | 10/2009 | Hou et al. |
| 7,906,836 B2* | 3/2011 | Chen et al. .................... 257/675 |
| 7,948,060 B2* | 5/2011 | Williamson et al. .......... 257/620 |
| 8,202,803 B2 | 6/2012 | Feurprier et al. |
| 2002/0050958 A1* | 5/2002 | Matthies et al. ................ 345/55 |
| 2004/0084777 A1* | 5/2004 | Yamanoue et al. ........... 257/758 |
| 2005/0017363 A1* | 1/2005 | Lin et al. ....................... 257/758 |
| 2006/0012012 A1* | 1/2006 | Wang et al. .................... 257/620 |
| 2006/0055005 A1* | 3/2006 | Furusawa et al. ............. 257/635 |
| 2009/0321890 A1* | 12/2009 | Jeng et al. ..................... 257/620 |
| 2011/0037140 A1 | 2/2011 | Tan et al. |

OTHER PUBLICATIONS

"Chip on Film (COF)", Retrieved on Jul. 27, 2012, pp. 1-2, http://www.chipmos.com/_en/02_product/02_detail.aspx?MainID=23&SubID=30.

* cited by examiner

SEMICONDUCTOR SEAL RING

RELATED APPLICATION(S)

This application claims the benefit of U.S. Patent Application No. 61/677,842, filed on Jul. 31, 2012, entitled "SEMICONDUCTOR SEAL RING" at least some of which is incorporated herein.

BACKGROUND

Integrated circuits generally comprise semiconductor devices and passive components manufactured on a surface of a substrate of semiconductor material. Generally, multiple integrated circuits are fabricated simultaneously on a semiconductor wafer. One or more individual integrated circuits are segregated from other integrated circuits by die saw cut lines, such as scribe lines. In this way, the semiconductor wafer is cut along the die saw cut lines once fabrication is complete to separate individual integrated circuits from one another, or rather to separate individual die from one another where multiple integrated circuits can be formed upon respective die. During sawing, the uppermost surfaces of integrated circuits are generally protected by of a passivation layer. However, the passivation layer cannot cover the periphery of the integrated circuits. Accordingly, a semiconductor seal ring is formed around the periphery of the integrated circuits as part of the fabrication of the integrated circuits prior to sawing. The semiconductor seal ring comprises a plurality of conductive layers arranged among a plurality of dielectric layers. The semiconductor seal ring provides structural reinforcement for the integrated circuits during sawing.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

Among other things, one or more systems and techniques for forming a semiconductor seal ring are provided herein. The semiconductor seal ring is formed over a semiconductor substrate upon which a semiconductor device is formed. The semiconductor seal ring comprises a plurality of dielectric layers, such as insulation layers. The semiconductor seal ring comprises a plurality of conductive layers arranged among at least some of the plurality of dielectric layers. One or more of the conductive layers are electrically coupled to one another by one or more vias, such as line vias or square vias. At least one of the conductive layers, such as a lower conductive layer formed near the semiconductor substrate, is electronically coupled to the semiconductor device using one or more contact posts.

The semiconductor seal ring comprises an upper conductive layer formed over the plurality of dielectric layers. The upper conductive layer is electrically coupled at least one of the conductive layers. Because the upper conductive layer is susceptible to electrical shorts caused by conductive debris associated with a die saw process, an upper passivation layer is formed over the upper conductive layer. The upper passivation layer is configured to electrically insulate the upper conductive film layer from conductive debris resulting from the die saw process. In an example, the upper passivation layer is configured according to a continuous configuration over the upper conductive film layer. In an example, the upper passivation layer comprises and oxide and nitride based material.

The semiconductor seal ring comprises a first columnar region, a second columnar region, and other columnar regions. The first columnar region comprises a first portion of the plurality of conductive layers. For example, the first columnar region comprises at least some conductive layers, dielectric layers, and vias formed between the upper conductive layer and a lower conductive layer. The second columnar region comprises a second portion of the plurality of conductive layers that is substantially adjacent to the first potion. For example, the second columnar region comprises at least some conductive layers, dielectric layers, and vias, substantially adjacent to the first portion, formed between the upper conductive layer and the lower conductive layer. The first columnar region is disposed between the second columnar region and a die saw cut line. The second columnar region is electrically coupled to the semiconductor device using at least one contact post, while the first columnar region is not electrically coupled to the semiconductor device. The first columnar region is not electronically coupled to the semiconductor device because the first columnar region has a relatively greater susceptibility to contamination by conductive debris resulting from the die saw process due to the first columnar region being disposed relatively closer to the die saw cut line, such as compared with the second columnar region, for example. In this way, electrical shorts are mitigated by the upper passivation layer and by not electrically coupling the first columnar region to the semiconductor device or rather the semiconductor substrate upon which the semiconductor device is formed.

The following description and annexed drawings set forth certain illustrative aspects and implementations. These are indicative of but a few of the various ways in which one or more aspects can be employed. Other aspects, advantages, and novel features of the disclosure will become apparent from the following detailed description when considered in conjunction with the annexed drawings.

DETAILED DESCRIPTION

Figure 1:
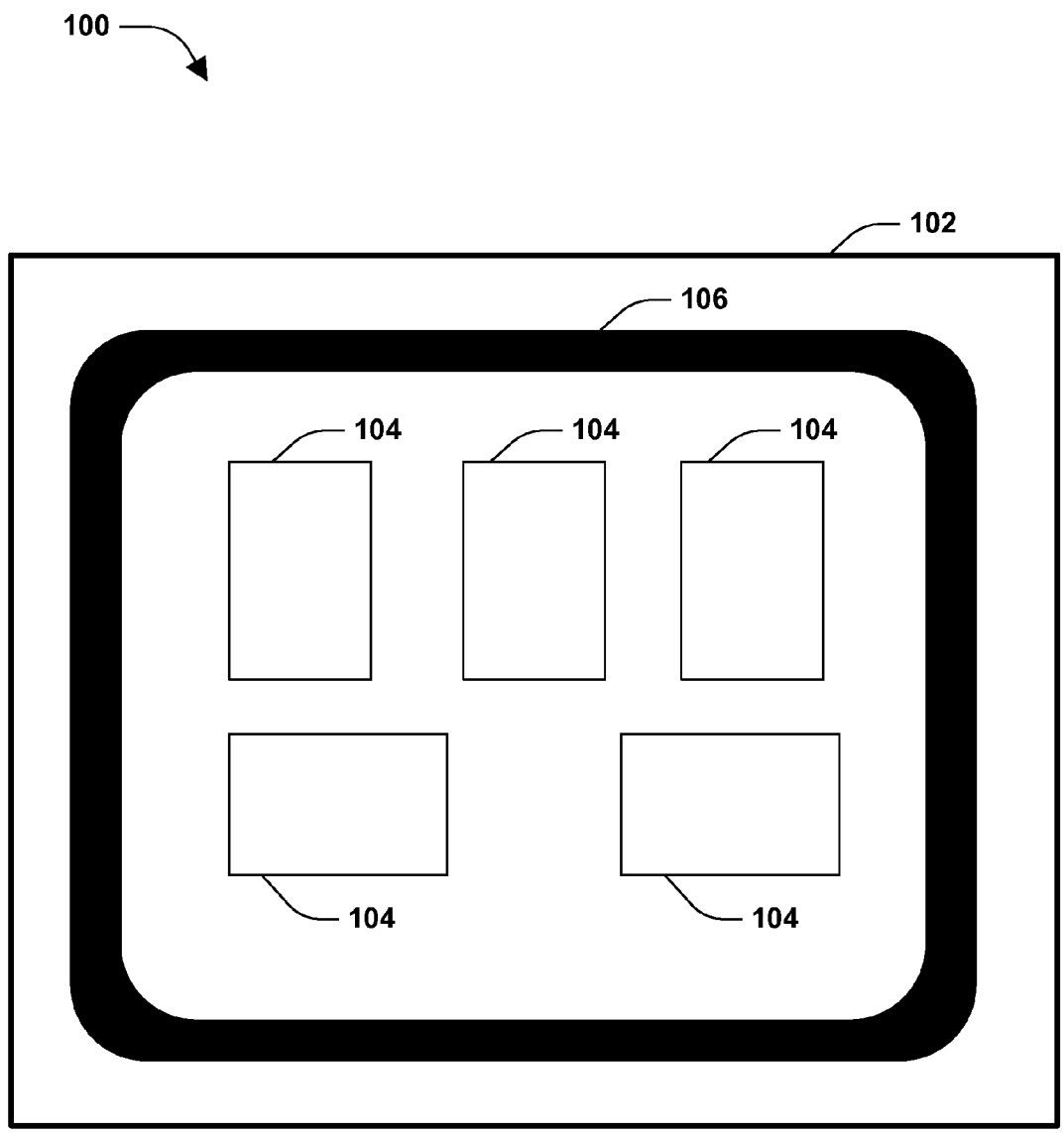
FIG. 1 is an illustration of an example of a semiconductor seal ring formed over a substrate, in accordance with various embodiments.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter can be practiced without these specific details. In other instances, structures and devices are illustrated in block diagram form in order to facilitate describing the claimed subject matter.

FIG. 1 illustrates an example 100, in accordance with various embodiments, of a semiconductor seal ring 106 formed over a substrate 102. One or more semiconductor devices 104 are formed on the semiconductor substrate 102. For example, the one or more semiconductor devices 104 comprise driver integrated circuits configured to drive a display panel, such as a screen of a mobile device, a tablet computing device, etc. Because the semiconductor substrate 102 comprises multiple semiconductor devices, at least some of the one or more semiconductor devices 104 are segregated by die saw cut lines, not illustrated. As the semiconductor substrate 102 is sawed by a die saw process, conductive debris and moisture can contaminate the one or more semiconductor devices 104, which can result in electrical shorts. Also, mechanical stress from sawing can result in cracks, fractures or other damage to at least some of the one or more semiconductor devices 104. Accordingly, the semiconductor seal ring 106 is formed within the semiconductor substrate 102 before sawing to mitigate such issues.

The semiconductor seal ring 106 provides structural reinforcement for the one or more semiconductor devices 104 during sawing. The semiconductor seal ring 106 also mitigates conductive debris and undesirable moisture from entering active regions of the one or more semiconductor devices 104. Unfortunately, conventional semiconductor seal rings are electronically coupled to a lowest potential, such as through the one or more semiconductor devices 104, which increases the likelihood of an electronic short due to conductive debris from the die saw process. Additionally, conventional semiconductor seal rings have portions of an upper conductive layer exposed due to a deep etch that is made to reduce mechanical stress during the die saw process. However, electronically coupling portions of the semiconductor seal ring 106, such as portions relatively close to die saw cut lines, and exposing portions of the upper conductive layer of the semiconductor seal ring 106 can render the semiconductor seal ring 106 susceptible to electrical shorts from conductive debris resulting from sawing.

Figure 2:
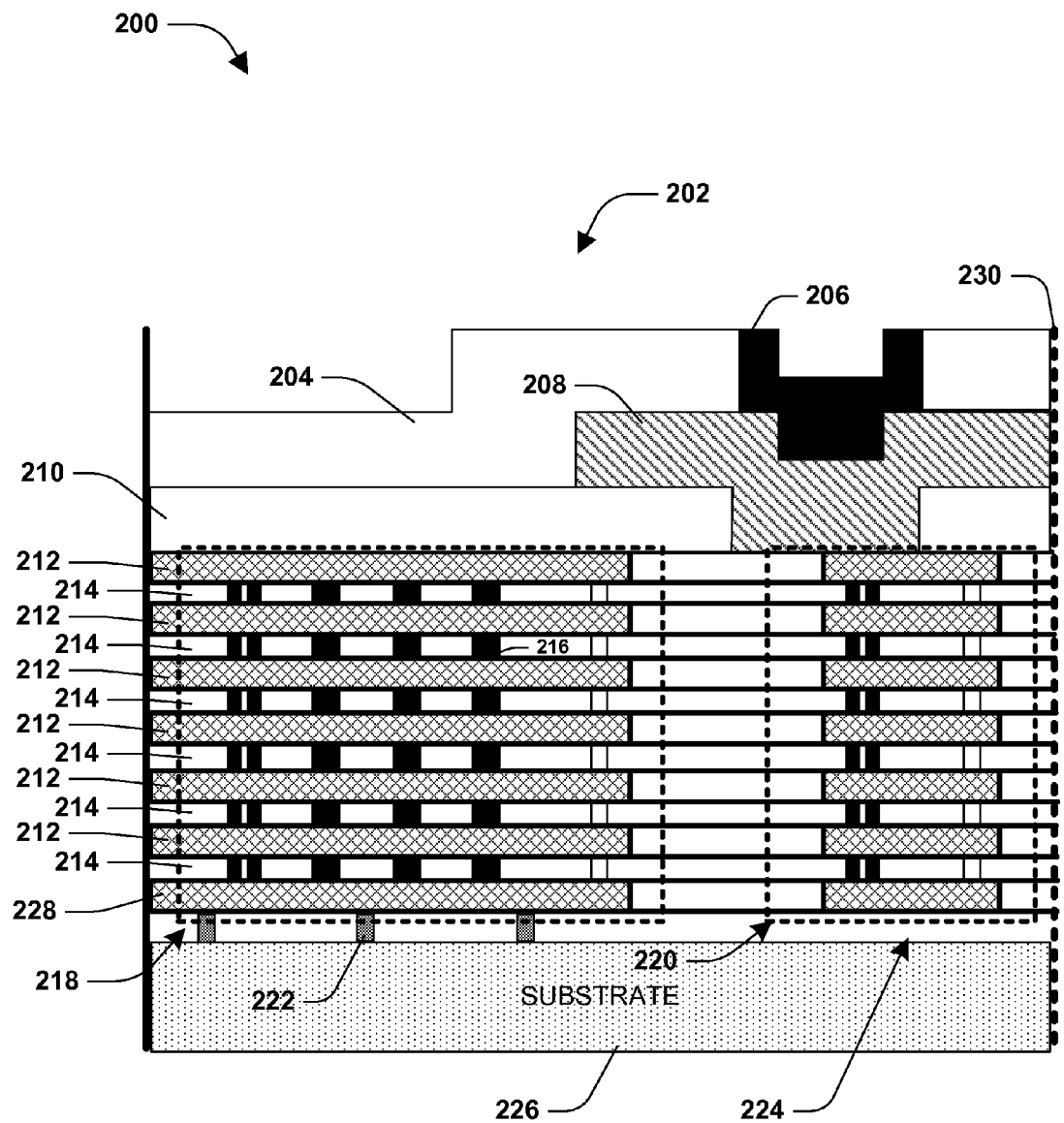
FIG. 2 is an illustration of an example of a cross-sectional view of semiconductor seal ring, in accordance with various embodiments.

FIG. 2 illustrates an example 200, in accordance with various embodiments, of a cross-sectional view of semiconductor seal ring 202. The semiconductor seal ring 202 comprises a plurality of dielectric layers 214 formed over a semiconductor substrate 226 upon which a semiconductor device and other semiconductor devices (nor shown) are formed. A plurality of conductive layers 212 is arranged among at least some of the plurality of dielectric layers 214. At least some of the plurality of conductive layers 212 are electrically coupled to one another by one or more vias, such as via 216. That is, a via electrically couples at least two conductive layers to one another through a dielectric layer of the plurality of dielectric layers 214. At least one conductive layer is electrically coupled to the semiconductor device formed within the semiconductor substrate 226. For example, a contact post 222 electrically couples a lower conductive layer 228 of a second columnar region 218 to the semiconductor substrate 226.

The semiconductor seal ring 202 comprises an upper conductive layer 208, such as a metal or doped layer. The upper conductive layer 208 is formed over at least some of the plurality of dielectric layers 214. The upper conductive layer 208 is electrically coupled to at least one of the plurality of conductive layers 212. Because the upper conductive layer 208 is susceptible to electrical shorts resulting from conductive debris from a die saw cut process, such as along die saw cut line 230, for example, an upper passivation layer 204 is formed over the conductive layer 208. The upper passivation layer 204 is configured to provide electrical insulation with regard to the upper conductive layer 208 relative to conductive debris associated with the die saw process. For example, a first portion 206 of the passivation layer 204 is formed as an insulating shield over the upper conductive layer 208 as opposed to being removed to enhance reinforcement against mechanical stress, for example, such that the upper conductive layer 208 is shielded by the first portion 206 relative to shorts that can result from conductive debris resulting from sawing along the die saw cut line 230. In an example, the upper passivation layer 204 comprises oxide nitride. It can be appreciated that in an example, one or more passivation layers are formed within the semiconductor seal ring 202. For example, in some embodiments, a lower passivation layer 210 is formed between the plurality of dielectric layers 214 and at least some of the upper conductive layer 208. Like the passivation layer 204, the lower passivation layer 210 can comprise an oxide material, a nitride material, and oxide nitride material, etc.

The semiconductor seal ring 202 comprises a first columnar region 220, the second columnar region 218, and other columnar regions not illustrated. The first columnar region 220 comprises a first portion of the plurality of conductive layers 214. For example, the first columnar region 220 comprises at least some conductive layers, dielectric layers, and vias formed between the upper conductive layer 208 and a lower conductive layer. The second columnar region 218 comprises a second portion of the plurality of conductive layers 214 substantially adjacent to the first portion. For example, the second columnar region 228 comprises at least some conductive layers, dielectric layers, and vias, substantially adjacent to the first portion, formed between the upper conductive layer 208 and the lower conductive layer 228. The first columnar region 220 is disposed between the second columnar region 218 and the die saw cut line 230. The second columnar region 218 is electrically coupled to the semiconductor device of the semiconductor substrate 226 using at least one contact post, such as contact post 222, for example. In contrast, the first columnar region 220 is not electrically coupled to the semiconductor device, as illustrated by a lack 224 of a contact post. The first columnar region 220 is not electronically coupled to the semiconductor device because the first columnar region 220 has a relatively higher susceptibility to being affected by conductive debris from sawing because the first columnar region 220 is disposed relatively closer to the die saw cut line 230 as compared to the second columnar region 218, for example. In this way, electrical shorts from sawing debris are mitigated by the upper passivation layer 204 and by not electrically coupling, such as through the lack 224 of a contact post, for example, the first columnar region 220 to the semiconductor device (not shown) formed on the semiconductor substrate 226.

Figure 3A:
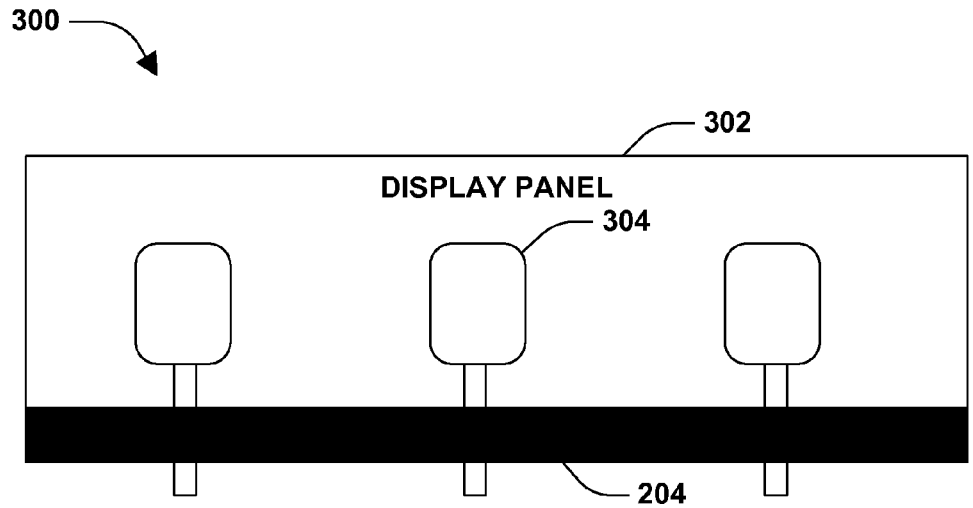
FIG. 3A is an illustration of an example of a top-down view of a semiconductor seal ring disposed between a display panel and a semiconductor substrate upon which a driver integrated circuit for the display panel is formed, in accordance with various embodiments.

FIG. 3A illustrates an example 300, in accordance with various embodiments, of a top-down view of a semiconductor seal ring disposed between a display panel 302 and a semiconductor substrate upon which a driver integrated circuit for the display panel 302 is formed. The display panel 302, for example, comprises a screen of an electronic device, such as a mobile phone, a tablet computing device, a GPS device, etc. In an example, the driver integrated circuit is coupled to the display panel 302 according to a chip-on-glass configuration. In another example, the driver integrated circuit is coupled to the display panel 302 according to a chip-on-film configuration. The display panel 302 comprises one or more panel pads, such as panel pad 304, configured to route electrical signals between the display panel 302 and the driver integrated circuit.

Figure 3B:
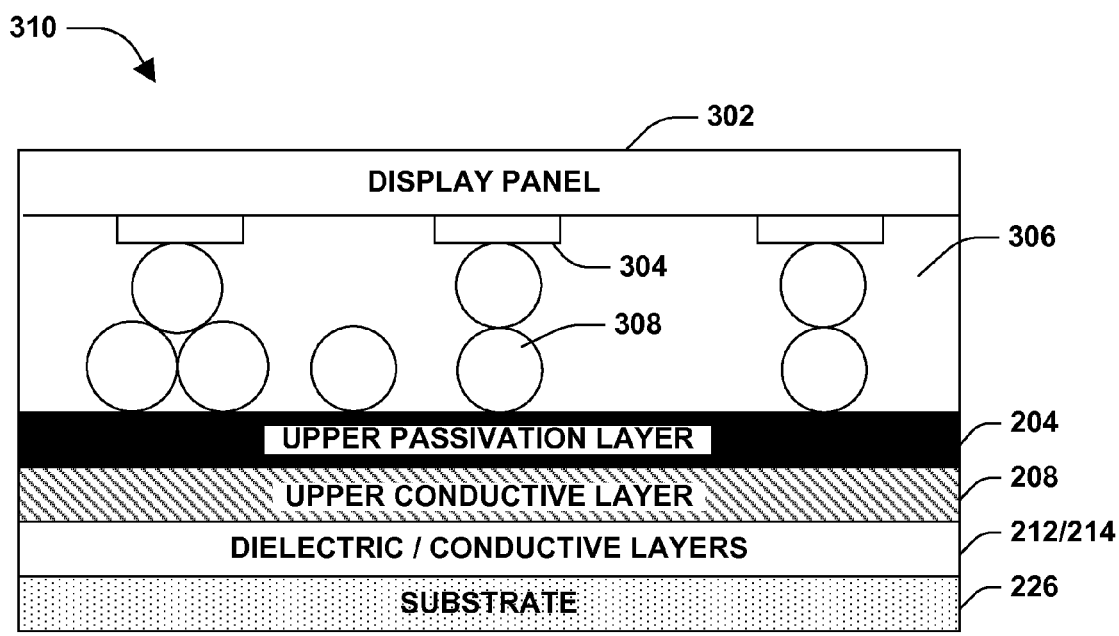
FIG. 3B is an illustration of an example of a cross-sectional view of a semiconductor seal ring disposed between a display panel and a semiconductor substrate upon which a driver integrated circuit for the display panel is formed, in accordance with various embodiments.

The semiconductor seal ring comprises a passivation layer 204 disposed between a conductive film layer 306, as shown in FIG. 3B, of the display panel 302 and an upper conductive layer 208 of the semiconductor seal ring. In this way, the passivation layer 204 shields the upper conductive layer 208 from conductive debris resulting from a die saw cut process used to cut the driver integrated circuit, or a die upon which the integrated circuit is formed, from a semiconductor wafer. In some embodiments, the passivation layer 204 mitigates electrical shorts by insulating the upper conductive layer 208, such that conductive debris cannot form an undesired conductive path from the panel pad 304 to the upper conductive layer 208.

FIG. 3B illustrates an example 310, in accordance with various embodiments, of a cross-sectional view of a semiconductor seal ring disposed between a display panel 302 and a semiconductor substrate 226 upon which a driver integrated circuit for the display panel 302 is formed. The semiconductor seal ring comprises a plurality of dielectric layers 212 formed over the semiconductor substrate 226. The semiconductor seal ring comprises a plurality of conductive layers 214 arranged among at least some of the plurality of dielectric layers 212. One or more of the conductive layers are electrically coupled to one another by one or more vias. The semiconductor seal ring comprises an upper conductive layer 208.

The semiconductor seal ring is disposed between a conductive film layer 306, such as an anisotropic conductive film, of the display panel 302. The conductive film layer 306 comprises one or more conductive particles 308 configured to electrically couple the driver integrated circuit to the display panel 302. For example, conductive particles 308 electrically couple a panel pad 304 of the display panel 302 to the driver integrated circuit, such as through one or more of the layers under layer 306. An upper passivation layer 204 is formed between the upper conductive layer 208 and the conductive film layer 306. The upper passivation layer 204 is configured to electrically insulate the upper conductive layer 208 from conductive debris associated with a die saw process used to cut the driver integrated circuit from a semiconductor wafer, which can otherwise result in an electrical short between the display panel 302, such as the panel pad 304, and the upper conductive layer 208, where such a short can be propagated or conducted from the panel 302 or pad 304 down to the substrate 226 or integrated circuit (not shown) formed thereon through one or more intervening layers.

Figure 4:
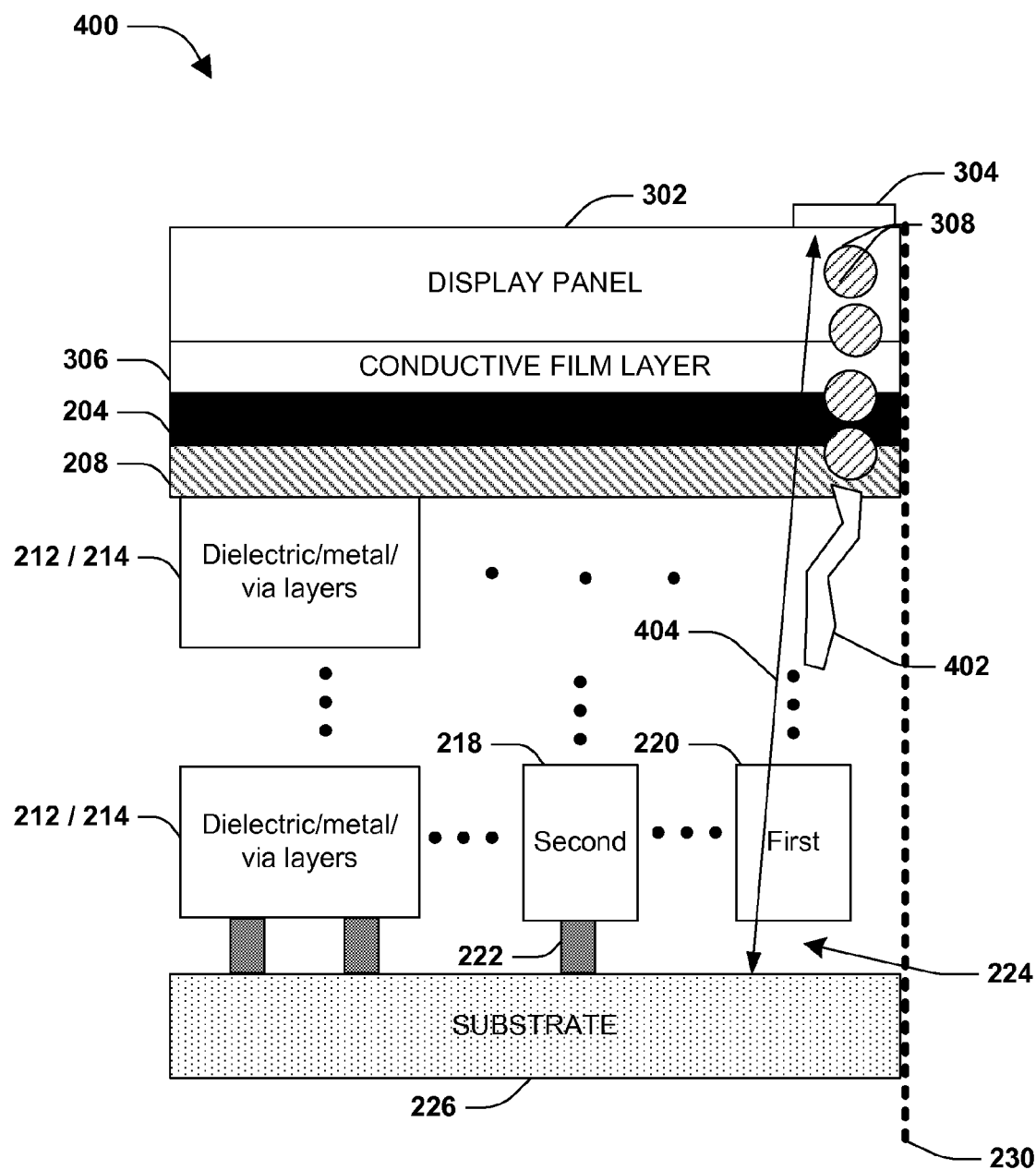
FIG. 4 is an illustration of an example of a cross-sectional view of a semiconductor seal ring disposed between a display panel and a semiconductor substrate upon which a driver integrated circuit for the display panel is formed, in accordance with various embodiments.

FIG. 4 illustrates an example 400, in accordance with various embodiments, of a cross-sectional view of a semiconductor seal ring disposed between a display panel 302 and a semiconductor substrate 226 upon which a driver integrated circuit (not shown) is formed. The semiconductor seal ring comprises a plurality of dielectric layers 212 formed over the semiconductor substrate 226. The semiconductor seal ring comprises a plurality of conductive layers 214 arranged among the plurality of conductive layers 212, where vias are used to electrically couple at least some conductive layers 214 to one another. One or more of the conductive layers can comprise metal or a doped material, such as doped polysilicon, for example. One or more of the dielectric layers can comprise an oxide material, for example. The semiconductor seal ring comprises a conductive layer 208 formed over the plurality of dielectric layers 212, and is electrically coupled to at least one of the conductive layers.

An upper passivation layer 204 is formed over the upper conductive layer 208. For example, the upper passivation layer 204 is formed between a conductive film layer 306 of the display panel 302 and the conductive layer 208 of the semiconductor seal ring. The conductive film layer 306 comprises one or more conductive particles 308 configured to electrically couple the driver integrated circuit to the display panel 302, such as to a panel pad 304 of the display panel 302. The upper passivation layer 204 is configured to provide electrical isolation for the upper conductive layer 208 relative to conductive debris 402 resulting from a die saw process along a die saw cut line 230. In this way, the upper passivation layer 204 mitigates electrical shorts between the display panel 302 and the driver integrated circuit formed on the substrate 226, such as can occur along line 404, for example, as such a short can originate between the upper conductive layer 208 and the pad 304 and be propagated or conducted down to the substrate, upon which the integrated circuit is formed, through one or more intervening layers such as one or more conductive layers 214.

In an example of the semiconductor seal ring, one or more of the conductive layers formed within the semiconductor seal ring are electrically coupled to one another by one or more vias. At least one of the conductive layers is electrically coupled to the driver integrated circuit within the semiconductor substrate 226. For example, a second columnar region 218 comprises a second portion of the plurality of conductive layers. The second columnar region 218, such as a lower conductive layer of the second columnar region 218, is electrically coupled to the driver integrated circuit by contact post 222. Because a first columnar region 220 is disposed between the second columnar region 218 and the die saw cut line 230, the first columnar region 220 is relatively susceptible to electrical shorts resulting from conductive debris 402 associated with the die saw process cutting along the die saw cut line 230. Accordingly, the first columnar region 220 is not electrically coupled to the driver integrated circuit, such as by the lack 224 of a contact post, for example. In this way, the lack 224 of a contact post provides electrical isolation between the first columnar region 220 and the driver integrated circuit, or rather the substrate 226 upon which the driver integrated circuit is formed, to mitigate electrical shorts, such as can occur along line 404, for example, from conductive debris 402.

Figure 5:
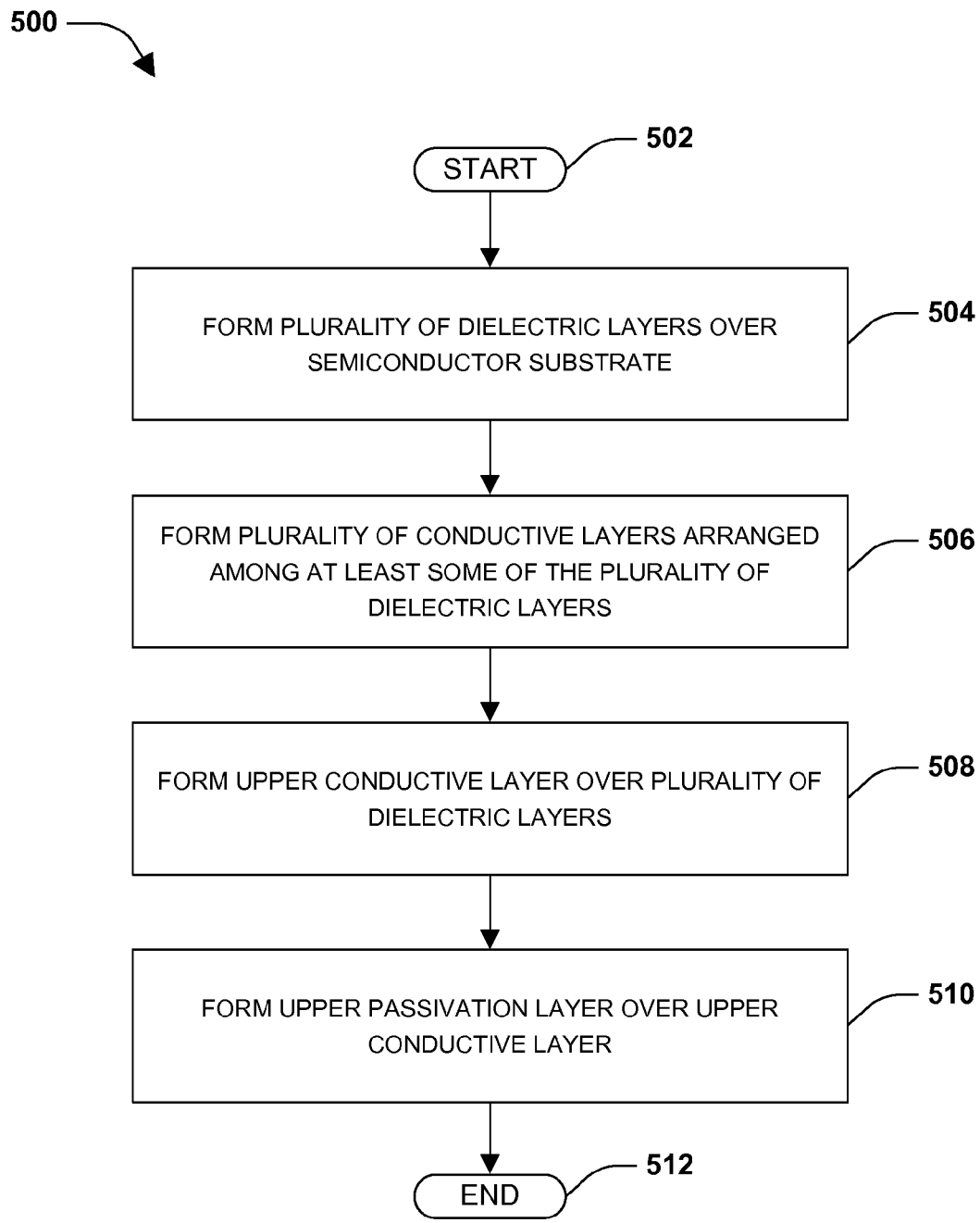
FIG. 5 is a flow diagram illustrating an example method of forming a semiconductor seal ring, in accordance with various embodiments.

An exemplary method 500 of forming a semiconductor seal ring in accordance with various embodiments of the present disclosure is illustrated in FIG. 5. At 502, the method starts. At 504, a plurality of dielectric layers is formed over a semiconductor substrate upon which a semiconductor device is formed. At 506, a plurality of conductive layers is arranged among at least some of the plurality of dielectric layers. At least some of the plurality of conductive layers are electrically coupled to one another by one or more vias. At least one of the conductive layers is electrically coupled to the semiconductor device. At 508, an upper conductive layer is formed over the plurality of dielectric layers. The upper conductive layer is electrically coupled to at least one of the conductive layers. At 510, an upper passivation layer is formed over the upper conductive layer. The upper passivation layer is configured to electrically insulate the upper conductive layer from conductive debris associated with a die saw process used to cut the semiconductor device from a semiconductor wafer, which can otherwise create electrical shorts.

In some embodiments, a first columnar region is formed within the plurality of conductive layers. The first columnar region comprises a first portion of the plurality of conductive layers. A second columnar region is formed within the plurality of conductive layers substantially adjacent to the first portion comprised within the first columnar region. The first columnar region is disposed between the second columnar region and a die saw cut line at which a die saw process cuts the semiconductor device, or die upon which the semiconductor device is formed, from the semiconductor wafer. The second columnar region is electrically coupled to the semiconductor device using one or more contact posts. Because the first columnar region is disposed between the second columnar region and the die saw cut line, the first columnar region is relatively susceptible to electrical shorts resulting from conductive debris associated with the die saw process along the die saw cut line. Accordingly, the first columnar region is not electrically coupled to the semiconductor device. In this way, electrical isolation between the first columnar region and the semiconductor device is provided to mitigate electrical shorts caused by conductive debris. At 512, the method ends.

According to an aspect of the instant disclosure, a semiconductor seal ring is provided. The semiconductor seal ring comprises a plurality of dielectric layers formed over a semiconductor substrate upon which a semiconductor device is formed. The semiconductor seal ring comprising a plurality of conductive layers arranged among at least some of the plurality of dielectric layers. One or more of the conductive layers are electrically coupled to one another by one or more vias. At least one conductive layer is electrically coupled to the semiconductor device. The semiconductor seal ring comprises an upper conductive layer formed over the plurality of electric layers, and is electrically coupled to at least one of the conductive layers. An upper passivation layer is formed over the upper conductive layer.

According to an aspect of the instant disclosure, a semiconductor seal ring is provided. The semiconductor seal ring comprises a plurality of dielectric layers formed over a semiconductor substrate upon which a semiconductor device is formed. The semiconductor seal ring comprising a plurality of conductive layers arranged among at least some of the plurality of dielectric layers. One or more of the conductive layers are electrically coupled to one another by one or more vias. At least one conductive layer is electrically coupled to the semiconductor device. The semiconductor seal ring comprises a first columnar region comprising a first portion of the plurality of conductive layers. The first columnar region is not electrically coupled to the semiconductor device. The semiconductor seal ring comprises a second columnar region comprising a second portion of the plurality of conductive layers substantially adjacent to the first portion. The first columnar region is disposed between the second columnar region and a die saw cut line. The second columnar region is electrically coupled to the semiconductor device using at least one contact post.

According to an aspect of the instant disclosure, a method for forming a semiconductor seal ring is provided. The method comprises, forming a plurality of dielectric layers over a semiconductor substrate upon which a semiconductor device is formed. A plurality of conductive layers is arranged among at least some of the plurality of dielectric layers. At least some of the plurality of conductive layers are electrically coupled to one another by one or more vias. At least one of the conductive layers is electrically coupled to the semiconductor device. An upper conductive layer is formed over the plurality of dielectric layers. The upper conductive layer is electrically coupled to at least one of the conductive layers. An upper passivation layer is formed over the upper conductive layer.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as electro chemical plating (ECP), etching techniques, wet remove techniques, implanting techniques, doping techniques, spin-on techniques, sputtering techniques such as magnetron or ion beam sputtering, growth techniques, such as thermal growth, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A semiconductor seal ring, comprising:
   a first columnar region comprising:
      a first plurality of dielectric layers formed over a semiconductor substrate upon which a semiconductor device is formed; and
      a first plurality of conductive layers arranged among at least some of the first plurality of dielectric layers, at least some of the first plurality of conductive layers electrically coupled to one another by a first set of one or more vias;
   a second columnar region comprising:
      a second plurality of dielectric layers formed over the semiconductor substrate; and a second plurality of conductive layers arranged among at least some of the second plurality of dielectric layers, at least some of the second plurality of conductive layers electrically coupled to one another by a second set of one or more vias;

a lower passivation region formed over the first columnar region and over the second columnar region; and an upper conductive layer formed over the first columnar region and through the lower passivation region, the upper conductive layer electrically isolated from the semiconductor substrate.

2. The semiconductor seal ring of claim 1, comprising an upper passivation layer formed over the upper conductive layer and over the lower passivation region.

3. The semiconductor seal ring of claim 2, the upper passivation layer formed according to a continuous configuration over the upper conductive layer.

4. The semiconductor seal ring of claim 1, comprising an upper passivation layer configured to electrically insulate the upper conductive layer from conductive debris associated with a die saw process.

5. The semiconductor seal ring of claim 1, the upper conductive layer in direct physical contact with a first conductive layer of the first plurality of conductive layers.

6. The semiconductor seal ring of claim 4, the upper passivation layer comprising oxide nitride.

7. The semiconductor seal ring of claim 1, the upper conductive layer comprising a metal layer.

8. The semiconductor seal ring of claim 1, the upper conductive layer electrically coupled to the first columnar region and electrically isolated from the second columnar region.

9. The semiconductor seal ring of claim 1, the first columnar region electrically isolated from the semiconductor substrate.

10. The semiconductor seal ring of claim 1, the first columnar region disposed between the second columnar region and a die saw cut line.

11. The semiconductor seal ring of claim 1, the second columnar region electrically coupled to the semiconductor substrate using at least one contact post.

12. The semiconductor seal ring of claim 1, the semiconductor device comprising a driver integrated circuit for a display panel.

13. A semiconductor seal ring, comprising:
a first columnar region electrically isolated from a semiconductor substrate upon which a semiconductor device is formed, comprising:
a first plurality of dielectric layers formed over the semiconductor substrate;
a first plurality of conductive layers arranged among at least some of the first plurality of dielectric layers, at least some of the first plurality of conductive layers electrically coupled to one another by a first set of one or more vias; and a second columnar region electrically coupled to the semiconductor substrate using a contact post, comprising:
a second plurality of dielectric layers formed over the semiconductor substrate; and
a second plurality of conductive layers arranged among at least some of the second plurality of dielectric layers, at least some of the second plurality of conductive layers electrically coupled to one another by a second set of one or more vias;

a lower passivation region formed over the first columnar region and over the second columnar region; and an upper conductive layer formed over the first columnar region and through the lower passivation region to contact a first conductive layer of the first plurality of conductive layers.

14. The semiconductor seal ring of claim 13, comprising:
an upper passivation layer formed over the upper conductive layer.

15. The semiconductor seal ring of claim 14, the upper passivation layer formed according to a continuous configuration over the upper conductive layer.

16. The semiconductor seal ring of claim 13, the upper conductive layer electrically isolated from the second columnar region.

17. The semiconductor seal ring of claim 14, the upper passivation layer configured to electrically insulate the upper conductive layer from conductive debris associated with a die saw process.

18. The semiconductor seal ring of claim 14, wherein no portion of the second columnar region extends through the lower passivation layer.

19. A method for forming a semiconductor seal ring, comprising:
forming a first columnar region comprising a first arrangement of dielectric layers and conductive layers;
forming a second columnar region comprising a second arrangement of dielectric layers and conductive layers;
forming a lower passivation region over the first columnar region and over the second columnar region; and
forming an upper conductive layer over the first columnar region and through the lower passivation region to electrically couple the first columnar region to the upper conductive layer, the upper conductive layer electrically isolated from a semiconductor substrate.

20. The method of claim 19, comprising:
forming a contact post over the semiconductor substrate, and the forming a second columnar region comprising:
forming the second columnar region over the contact post to electrically couple the second columnar region to the semiconductor substrate.

* * * * *